US008785322B2

(12) United States Patent
Ando et al.

(10) Patent No.: US 8,785,322 B2
(45) Date of Patent: Jul. 22, 2014

(54) DEVICES AND METHODS TO OPTIMIZE MATERIALS AND PROPERTIES FOR REPLACEMENT METAL GATE STRUCTURES

(75) Inventors: Takashi Ando, Tuckahoe, NY (US); Christian Lavoie, Pleasantville, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 13/017,809

(22) Filed: Jan. 31, 2011

(65) Prior Publication Data

US 2012/0193729 A1    Aug. 2, 2012

(51) Int. Cl.
*H01L 21/4763* (2006.01)
*H01L 21/336* (2006.01)

(52) U.S. Cl.
USPC .............. 438/630; 438/300; 257/E21.444

(58) Field of Classification Search
USPC .................. 257/E21.444; 438/630
See application file for complete search history.

(56) References Cited

U.S. PATENT DOCUMENTS 6,072,221 A *  6/2000 Hieda ........................... 257/382
6,905,560 B2   6/2005 Cabral, Jr. et al.
7,119,012 B2  10/2006 Carruthers et al.
7,271,486 B2   9/2007 Cabral, Jr. et al.
7,419,907 B2   9/2008 Detavernier et al.
7,517,795 B2   4/2009 Carruthers et al.
7,732,870 B2   6/2010 Detavenier et al.
7,786,578 B2   8/2010 Detavenier et al.
2002/0179980 A1* 12/2002 Yagishita et al. ............. 257/384
2003/0008496 A1*  1/2003 Deleonibus ................... 438/630
2005/0224886 A1* 10/2005 Doyle et al. .................. 257/368
2007/0141798 A1*  6/2007 Bohr ............................. 438/301
2010/0117238 A1*  5/2010 Nemouchi et al. ............ 257/754

OTHER PUBLICATIONS

Khater, M., et al. "High-K/Metal-Gate Fully Depleted SOI CMOS With Single-Silicide Schottky Source/Drain With Sub-30-nm Gate Length" IEEE Electron Device Letters, vol. 31, No. 4. Apr. 2010. pp. 275-277.

Zhang, Z., et al. "Sharp Reduction of Conact Resistivities by Effective Schottky Barrier Lowering With Silicides as Diffusion Sources" IEEE Electron Device Letters, vol. 31, No. 7. Jul. 2010. pp. 731-733.

* cited by examiner

*Primary Examiner* — Daniel Luke
(74) *Attorney, Agent, or Firm* — Tutunjian & Bitetto, P.C.; Louis J. Percello

(57) ABSTRACT

Devices and methods for device fabrication include forming a gate structure with a sacrificial material. Silicided regions are formed on source/drain regions adjacent to the gate structure or formed at the bottom of trench contacts within source/drain areas. The source/drain regions or the silicided regions are processed to build resistance to subsequent thermal processing and adjust Schottky barrier height and thus reduce contact resistance. Metal contacts are formed in contact with the silicided regions. The sacrificial material is removed and replaced with a replacement conductor.

18 Claims, 3 Drawing Sheets

DEVICES AND METHODS TO OPTIMIZE MATERIALS AND PROPERTIES FOR REPLACEMENT METAL GATE STRUCTURES

BACKGROUND

1. Technical Field

The present invention relates to semiconductor device fabrication and more particularly to metal replacement gate structures and fabrication methods which provide flexibility in material selection and properties of devices associated therewith.

2. Description of the Related Art

Replacement metal gate structures have gained increased interest in the semiconductor processing industry. Replacement metal gate structures are provided by a process in which a metal gate conductor is introduced once a semiconductor device is fully formed. While replacement metal gates permit some advantages, the replacement metal gate structures suffer from important restrictions with respect to what the device needs to withstand during its formation and what the maximum thermal budget is once the metal gate process is completed.

Typically, the process for metal gate tuning requires about 600 degrees Celsius. Once the metal gate structure is completed, the thermal budget does not permit much more than 400 degrees Celsius. Any material deposited or formed before the gate is replaced must withstand a relatively high temperature anneal (~600 degrees Celsius). No material process that follows the metal gate anneal can have a high thermal budget (e.g., greater than 400 degrees Celsius).

In a standard process flow, in which the gate is formed before dopant implantation, the gate is designed to withstand the dopant activation anneal of about 1000 C. In this case, post silicide engineering using incorporation of an impurity followed by annealing is possible since early gate processing necessitates high stability for the gate and allows additional thermal budget.

In a replacement gate process, however, the silicide can, in principle, be formed either before or after the final gate is formed. When the silicide is formed before the replacement of the gate, thermal budget and silicide engineering is allowed but the silicide needs to withstand the high temperature treatment associated with the replacement of the gate. The proximity to the device channel and end of range (EOR) defects lead to multiple defects that are very hard to work with and can cause major yield degradation.

If the silicidation is performed after the replacement gate process, additional thermal processing in the 600 C range is not possible since the gate would drastically deteriorate. When the silicide is performed after gate metal replacement, the thermal budget is not acceptable and the contact resistance cannot be engineered through implants and anneals.

SUMMARY

Devices and methods for device fabrication include forming a gate structure with a sacrificial material. Silicided regions are formed on source/drain regions adjacent to the gate structure or formed at the bottom of trench contacts within source/drain areas. The source/drain regions or the silicided regions are processed to build resistance to subsequent thermal processing and adjust Schottky barrier height and thus reduce contact resistance. Metal contacts are formed in contact with the silicided regions. The sacrificial material is removed and replaced with a replacement conductor. The silicide is preferably formed at the bottom of the contact trenches followed by material treatment and the directly covered with a metal fill (e.g., W, Cu) before a replacement gate process.

A method for device fabrication includes forming a gate structure with a sacrificial material and source/drain regions adjacent to the gate structure; patterning contact trenches in a dielectric layer over the source/drain regions; forming silicided regions on the source/drain regions at bottoms of the contact trenches to localize silicide formation; forming contacts in contact with the silicided regions; and after forming the contacts, removing the sacrificial material and replacing the sacrificial material with a replacement conductor.

Another method for device fabrication includes forming a gate structure with a sacrificial material; processing source/drain regions adjacent to the gate structure to build resistance to subsequent thermal processing; forming contact trenches in a dielectric layer over the source/drain regions; forming silicided regions on the source/drain regions in the contact trenches; processing the silicided regions; forming contacts in the contact trenches; and removing the sacrificial material and replacing the sacrificial material with a replacement conductor.

A semiconductor device includes a replacement gate metal structure having a metal gate conductor formed therein and source and drain regions formed adjacent to the replacement gate metal structure. A dielectric layer has contact trenches formed therein, and silicided regions are formed on the source and drain regions from inside a bottom of the contact trenches to localize silicidation. Contacts are formed over the silicided regions. At least one silicide agglomeration resistant material is integrated into the silicided regions to resist thermal degradation of the silicided regions and reduce contact resistance between the silicided regions and the contacts.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
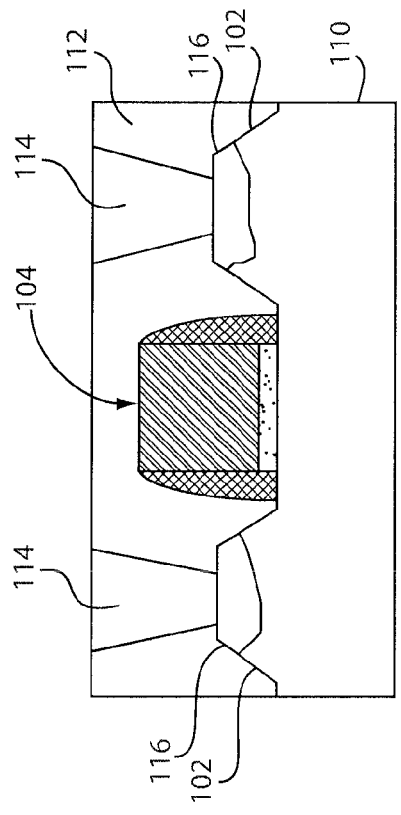
FIG. 1A is a cross-sectional view of a semiconductor device having raised source/drain regions formed adjacent to a gate structure having a sacrificial material in accordance with the present principles.

In accordance with the present principles, a replacement metal gate (RMG) structure is provided where the gate is replaced after silicide formation. By introducing impurities or formation of compounds in the silicide regions, a thermal budget of the gate replacement is resisted by the silicided regions. In fact, the thermal budget of the gate replacement is employed to further process the silicide regions to reduce contact resistance and to permit an increased thermal budget for performing the gate replacement after the silicided regions have been formed.

In one embodiment, a device and method are provided in which both the silicide at a bottom of trenches and contacts (e.g., W) are formed before the gate is replaced. This process permits silicide engineering to occur in which post silicide modifications through implantation and anneals are possible before the metal gate is replaced. The extra thermal budget necessary for the metal gate becomes beneficial for Schottky barrier lowering of the contact.

The flowchart and block diagrams in the Figures illustrate the architecture, functionality, and operation of possible implementations of systems, methods and products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and instructions.

It is to be understood that the present invention will be described in terms of a given illustrative architecture having a semiconductor wafer; however, other architectures, structures, substrate materials and process features and steps may be varied within the scope of the present invention.

Semiconductor devices/circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIGS. 1A-1G, cross-sectional views are illustratively depicted showing a fabrication process for a gate metal replacement process in accordance with the present principles.

FIG. 1A shows a device 100 having source and drain regions 102 to be contacted formed on or in a semiconductor substrate 110. The substrate 110 may include a bulk substrate of silicon or other semiconductor material or may include a composite layered substrate, such as a semiconductor-on-insulator (SOI) substrate. The source and drain regions 102 may be raised and may include an epitaxially grown SiGe or Si(C). A gate structure 104 includes a gate material 106 to be replaced. The gate material 106 may include any material that can be selectively removed in accordance with the gate replacement strategy. A gate dielectric 108 may also be replaced. The gate dielectric 108 may include a gate oxide or other material. The gate dielectric 108 may also include a high dielectric constant material (high K dielectric, such as Hf oxide, oxynitride, etc.) or other layer. The introduction of dopants into the substrate 110 may be performed before and/or after the formation of gate structure 104. Implantation may include the formation of a channel region, halo implants, source/drain implantations, etc.

Figure 1B:
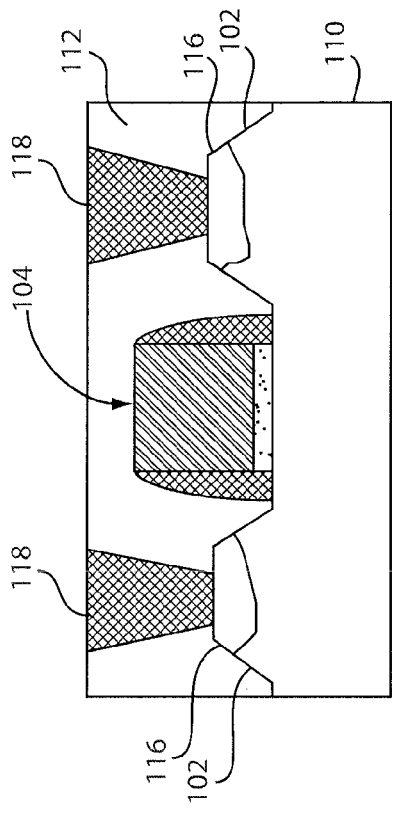
FIG. 1B is a cross-sectional view of the semiconductor device of FIG. 1A having a dielectric layer formed over the raised source/drain regions and having contact trenches formed over the raised source/drain regions in accordance with the present principles.

In FIG. 1B, a first dielectric layer 112 is deposited and patterned to form contact trenches 114. The dielectric layer 112 may include an oxide or a nitride, such as a silicon oxide or nitride. In some useful embodiments, additional ion implantations may be performed and anneals may be performed for Schottky adjustment or morphological stability (of a silicide to be formed) during annealing.

Figure 1C:
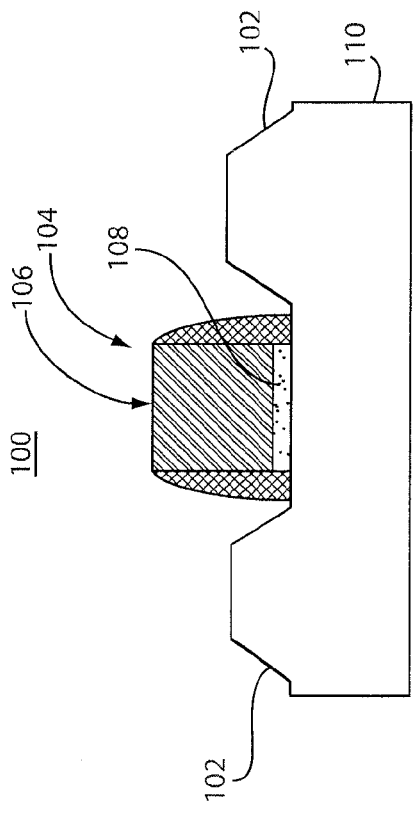
FIG. 1C is a cross-sectional view of the semiconductor device of FIG. 1B having silicided regions formed over the raised source/drain regions in the contact trenches in accordance with the present principles.

In FIG. 1C, a self-aligned silicidation is performed at a bottom of the trenches 114 to form silicified junctions 116. At this point, implants and additional anneals may also be performed. Fonting the silicide 116 in trenches 114 permits the localization of the silicide keeping the silicide away from the device channel (under the gate structure 104) and other sensitive regions.

In FIGS. 1B and/or 1C, dopants such as, e.g., B, As, P, etc. or other impurities, such as, e.g., Se, S, F, etc. may be introduced (e.g., implanted) into the Si or other material of the source and drain regions 102 prior to silicidation (FIG. 1B) or into the formed silicide 116 of the source and drain regions 102 (FIG. 1C). Anneals prior (FIG. 1B) and post silicidation (FIG. 1C) may also be performed to provide improvements in contact resistance and provide resistance to further thermal budget (e.g., the thermal budget associated with the gate replacement as will be described). Since the silicide 116 will see a higher thermal budget, the silicide composition may benefit from using materials or processes resistant to agglomeration.

Figure 1D:
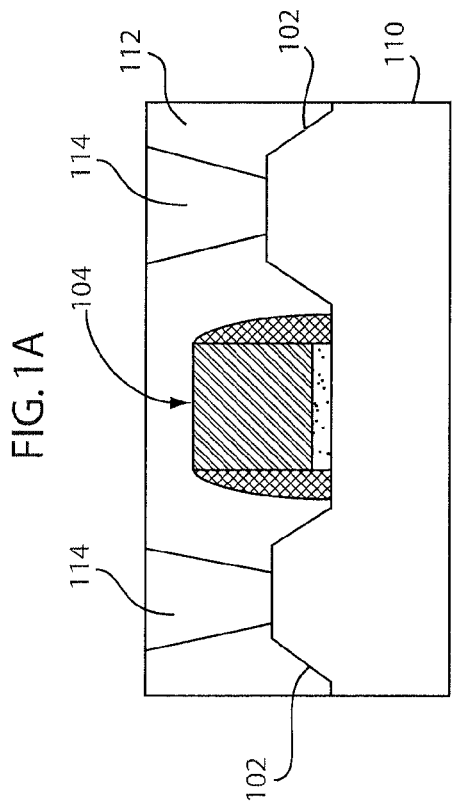
FIG. 1D is a cross-sectional view of the semiconductor device of FIG. 1C having contacts formed in contact with the silicided regions and formed in the contact trenches in accordance with the present principles.

In FIG. 1D, contacts 118 are formed. This may include depositing a liner and a conductor such as, e.g., W, Cu or other conductor (depending on the application) in trenches 114 and planarizing a top surface using, e.g., a chemical mechanical polish (CMP) or other planarization method. By forming the silicide 116 at a bottom of trenches 114 and then forming the contacts 118 before the gate is replaced, silicide engineering is permitted to occur in which post silicide modifications through implantation and anneals are possible before the gate material is replaced. The extra thermal budget necessary for the replacement gate becomes beneficial for Schottky barrier lowering of the contacts among other advantages.

Figure 1E:
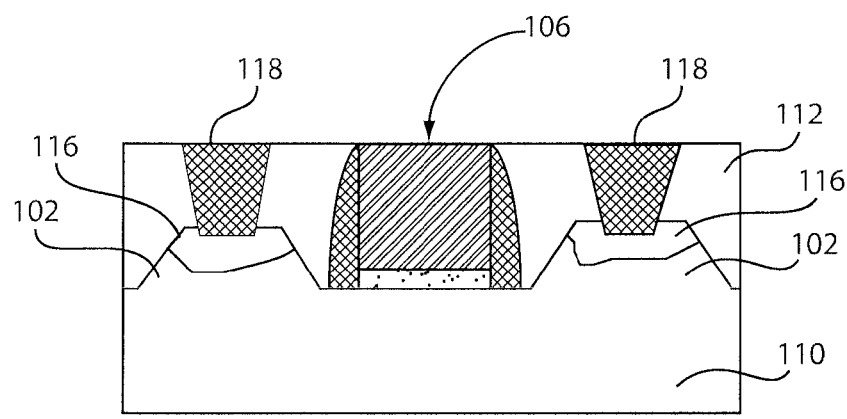
FIG. 1E is a cross-sectional view of the semiconductor device of FIG. 1D having a top surface planarized to expose the sacrificial material in the gate structure in accordance with the present principles.

In FIG. 1E, the planarization (CMP) continues until a top of the gate material 106 (e.g., polysilicon or any sacrificial gate material) is reached. This exposes the gate material 106.

Figure 1F:
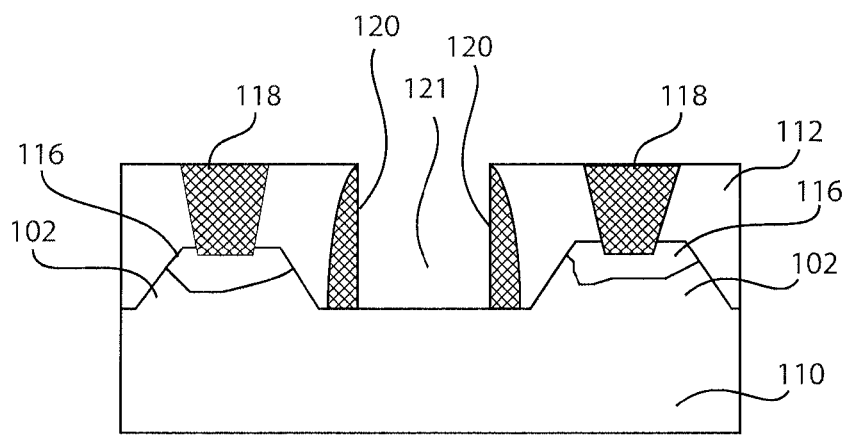
FIG. 1F is a cross-sectional view of the semiconductor device of FIG. 1E having the sacrificial material removed from the gate structure in accordance with the present principles.

In FIG. 1F, the gate material 106 is etched. In addition, any dielectric material (e.g., gate dielectric 108) may also be etched in a same or different etching process. The contacts 118 may need to be protected. If so a mask (not shown) is formed on layer 102 and over contacts 118 for protection. The etching process may include a wet or dry etch and may include an anisotropic etch such as a reactive ion etch. The etch is performed selectively with respect to spacers 120 and any other components, e.g., with respect to the mask formed to protect the contacts 118. A void 121 is formed so that replacement materials may be deposited in subsequent steps.

Figure 1G:
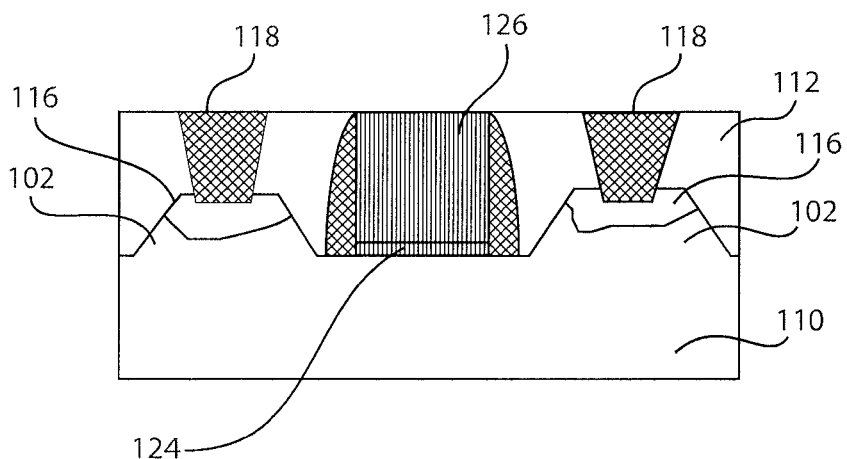
FIG. 1G is a cross-sectional view of the semiconductor device of FIG. 1F having a metal formed in the gate structure to provide a replacement gate metal structure in accordance with the present principles.

In FIG. 1G, the gate material 106 is replaced with an optional high K dielectric 124 and a metal 126. In another embodiment, the metal 126 replaces the gate material 106 and a high K dielectric formed earlier remains. In yet another embodiment, a high K dielectric is formed followed by the metal 126, which replaces the gate conductor 106. Other combinations of materials in the gate structure 102 may be provided.

In accordance with the illustrative embodiments, both the silicidation in the contact trenches 114 followed by formation of contacts 118 (e.g, W or other metal) will precede the gate replacement metal formation. One advantage of this method includes that the replacement metal gate (RMG) process has a thermal budget for the silicide to reach a lower contact resistance value. By providing the silicided junctions for the contacts 118, the thermal budget needed to replace the gate material 106 has a beneficial effect by further forming the silicide and lowering the contact resistance between the source and drain regions 102 and the contacts 118. In addition, process steps may be employed to assist in lowering contact resistance.

For example, in one embodiment, dopants such as, e.g., B, As, P, etc. or other impurities, such as, e.g., Se, S, F, etc. may be implanted into the Si or other material of the source and drain regions 102 prior to silicidation or into the formed silicide of the source and drain regions 102. Millisecond anneals prior and post silicidation may also be performed to provide improvements in contact resistance or other advantages. Such anneals are preferably employed in a scenario where the silicide is formed before the replacement gate process is carried out.

Since the silicide sees a higher thermal budget, the silicide composition may benefit from using materials resistant to agglomeration. Materials resistant to agglomeration may include, e.g., the inclusion of Pt, C, or the formation of ternary alloys, such as, e.g., Ni—Pt—C or Ni—Pt—W. In addition, processing may include low temperature ion implantations to reduce agglomeration in the silicided regions. To control agglomeration of silicide and germanosilicides, Pt and C in addition to NiSi are particularly efficient. To control Schottky barrier heights, implantation of standard dopants or co-implantation of dopants and additional impurities such as, e.g., F, S, Se, Al and N appear to be most efficient. While the Schottky barrier adjustment can be achieved at lower temperatures on p-doped SiGe material, it is found that 600 C is often necessary for nFET transistors.

Figure 2:
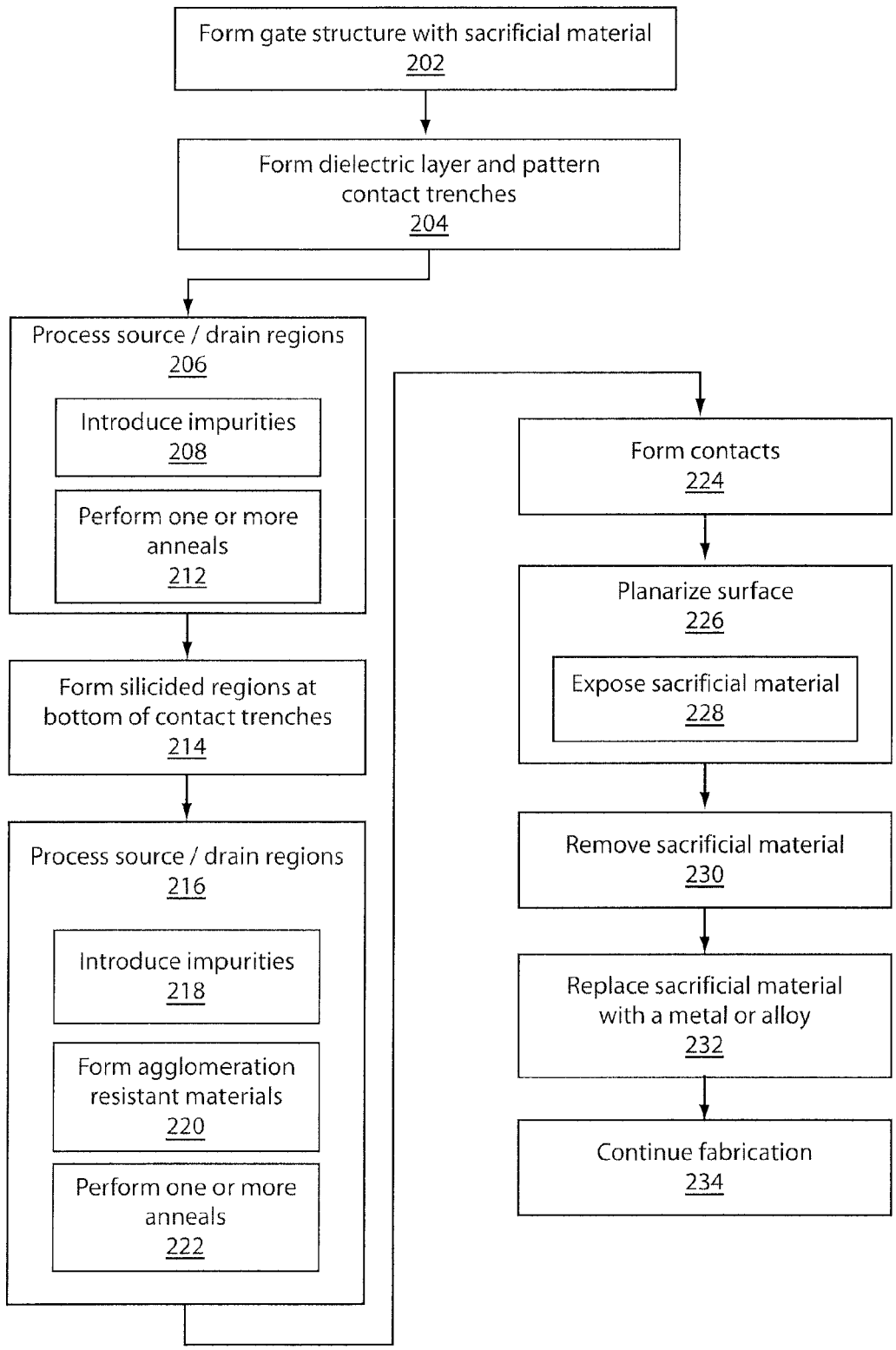
FIG. 2 is a block/flow diagram showing illustrative methods for fabricating a semiconductor device using a replacement gate metal structure in accordance with the present principles.

Referring to FIG. 2, a method for device fabrication is illustratively shown. The method provides a replacement metal gate process in accordance with the present principles. In block 202, a gate structure is formed having a sacrificial gate conductor material. The gate structure may include spacers, a gate dielectric (e.g., a gate oxide or other dielectric materials such as a high-K dielectric), etc. The gate structure is formed on a substrate which preferably includes source and drain regions formed therein. In block 204, a dielectric layer is formed over the gate structure and the source/drain regions. The dielectric layer is patterned to form contact trenches.

In block 206, in one embodiment, the source/drain regions adjacent to the gate structure are optionally processed to build resistance and stability against subsequent thermal processing prior to silicidation. In block 208, the processing may include providing impurities in the source/drain regions (e.g., implanting through the contact trenches, or by deposition or diffusion from another region) to reduce contact resistance and to resist thermal degradation of the later formed silicided regions. The impurities may include one or more of B, As, P, Se, S, F or other impurities. In block 212, one or more annealing processes may be performed. The processing provides for Schottky adjustment and thermal stability in the silicided regions that will be formed in subsequent steps. In performing blocks 208 and 212 before silicidation, since two consequences may result: 1) a silicide that is resistant to agglomeration may occur and/or a silicide that has a lower Schottky barrier to Si may occur.

In block 214, silicided regions are formed on source/drain regions adjacent to the gate structure. The silicidation is preferably performed at the bottom of the contact trenches to localize the silicidation.

In block 216, in one embodiment, the silicided regions are processed to build resistance to subsequent thermal processing. It should be understood that the processing may be performed on the source/drain regions prior to silicidation (block 206), on the silicided regions after silicidation (block 216) or both.

In block 218, the processing may include introducing impurities in the silicided regions (e.g., implantation through the contact trenches, deposition or diffusion, etc.) to reduce contact resistance and to resist thermal degradation of the silicided regions. The impurities may include one or more of B, As, P, Se, S, F or other impurities. In block 220, the processing may include forming materials resistant to agglomeration in the silicided regions. The materials resistant to agglomeration may include Pt, C, and/or ternary alloys. In block 222, one or more annealing processes may be performed to reduce contact resistance and optimize gate properties. In accordance with the present principles, the present process maintains thermal degradation resistance of the silicided regions during these annealing processes. The anneal processes may include, e.g., 600 degrees C. for 30 seconds, laser annealing at about 900 degrees C. for a few milliseconds, etc.

The processing provides for Schottky adjustment and thermal stability in the silicided regions. Since the silicide melts at much lower temperatures than its Si counterpart (e.g., by more than 400 degrees C.), diffusion in the silicide material is much faster at 600 degrees C. and an anneal permits diffusion of impurities in the silicide and segregation to interfaces. For the thermal budget suggested, dopants in the semiconductor are not significantly mobile. This segregation of dopants to interfaces leads to a Schottky barrier lowering and a reduction of contact resistance. In performing blocks 218 and 222, a silicide that is resistant to agglomeration may occur and/or a silicide that has a lower Schottky barrier to Si may occur.

In block 224, contacts are deposited in contact trenches in contact with the silicided regions. The contacts may include W, Cu, or other conductive materials. In block 226, a top surface of the device is planarized. The planarization may include a chemical mechanical polish, an etch, etc. In block 228, the planarization is continued until the sacrificial gate material is reached. The addition of impurities assists morphological stability by limiting diffusion in the material. Forming the silicide at the bottom of the trench maintains the metal a little further away from the channel such that small incursions are not damaging.

In block 230, the sacrificial material is removed from the gate structure. This may be performed using an etch process. In block 232, the sacrificial material is replaced with a replacement conductor, such as a metal or a metal alloy. The replacement conductor may include one or more of Cu, W, Al, conducting metal nitrides, metal silicides or metal germanides. A high dielectric constant dielectric, such as Hf oxide or oxynitride, etc. may be formed before depositing the replacement metal, or the high dielectric constant material may have been previously formed in the gate structure and maintained in the gate structure prior to adding the replacement metal. In block 234, fabrication continues to complete the device. This may include standard processing techniques.

Having described preferred embodiments of a devices and methods to optimize materials and properties for replacement metal gate structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for device fabrication, comprising:
    forming a gate structure with a sacrificial material and raised source/drain regions adjacent to the gate structure;
    patterning contact trenches in a dielectric layer over the raised source/drain regions;
    forming silicided regions on the raised source/drain regions at bottoms of the contact trenches to localize silicide formation;
    processing the silicided regions to build resistance to subsequent thermal processing wherein the processing includes introducing impurities through the contact trenches into the silicided regions of the raised source/drain regions to reduce thermal degradation of the silicided regions;
    forming contacts in contact with the silicided regions; and
    after forming the silicided regions and the contacts, removing the sacrificial material and replacing the sacrificial material with a replacement conductor.

2. The method as recited in claim 1, wherein the impurities include one or more of B, As, P, Se, S and F.

3. The method as recited in claim 1, wherein processing includes forming materials resistant to agglomeration in the silicided regions.

4. The method as recited in claim 3, wherein the materials resistant to agglomeration include Pt, C, and/or ternary alloys.

5. The method as recited in claim 1, wherein processing includes providing for Schottky barrier adjustment and thermal stability in the silicided regions.

6. The method as recited in claim 1, wherein replacing the sacrificial material with a replacement conductor includes replacing the sacrificial material with a metal.

7. The method as recited in claim 1, wherein replacing the sacrificial material with a replacement conductor includes forming a high dielectric constant dielectric and forming a metal gate conductor in the gate structure.

8. The method as recited in claim 1, wherein the method maintains thermal degradation resistance during one or more annealing processes.

9. The method as recited in claim 1, wherein forming a gate structure with a sacrificial material includes forming a gate dielectric with a high dielectric constant material.

10. A method for device fabrication, comprising:
    forming a gate structure with a sacrificial material and raised source/drain regions adjacent to the gate structure;
    processing the raised source/drain regions adjacent to the gate structure to build resistance to subsequent thermal processing;
    forming contact trenches in a dielectric layer over the raised source/drain regions;
    forming silicided regions on the raised source/drain regions in the contact trenches;
    processing the silicided regions to build resistance to subsequent thermal processing wherein the processing includes introducing impurities through the contact trenches into the silicided regions of the raised source/drain regions to reduce thermal degradation of the silicided regions;
    forming contacts in the contact trenches; and
    after forming the silicided regions and the contacts, removing the sacrificial material and replacing the sacrificial material with a replacement conductor.

11. The method as recited in claim 10, wherein the impurities include one or more of B, As, P, Se, S and F.

12. The method as recited in claim 10, wherein processing the silicided regions includes forming materials resistant to silicide agglomeration.

13. The method as recited in claim 12, wherein the materials resistant to silicide agglomeration include Pt, C, and/or ternary alloys.

14. The method as recited in claim 10, wherein replacing the sacrificial material with a replacement conductor includes replacing the sacrificial material with a metal.

15. The method as recited in claim 10, wherein replacing the sacrificial material with a replacement conductor includes forming a high dielectric constant dielectric and forming a metal gate conductor in the gate structure.

16. The method as recited in claim 10, wherein processing source/drain regions includes performing one or more annealing processes.

17. The method as recited in claim 10, wherein processing the silicided regions includes providing for Schottky barrier adjustment and thermal stability in the silicided regions.

18. The method as recited in claim 10, wherein forming a gate structure with a sacrificial material includes forming a gate dielectric with a high dielectric constant material.

* * * * *